(12) United States Patent
Basser et al.

(10) Patent No.: US 11,415,652 B2
(45) Date of Patent: Aug. 16, 2022

(54) MULTI-DIMENSIONAL SPECTROSCOPIC NMR AND MRI USING MARGINAL DISTRIBUTIONS

(71) Applicant: The United States of America, as represented by the Secretary, Department of Health and Human Services, Bethesda, MD (US)

(72) Inventors: Peter J. Basser, Washington, DC (US); Dan H. Benjamini, Rockville, MD (US)

(73) Assignee: The United States of America, as represented by the Secretary, Department of Health and Human Services, Bethesda, MD (US)

( * ) Notice: Subject to any disclaimer, the term of this patent is extended or adjusted under 35 U.S.C. 154(b) by 840 days.

(21) Appl. No.: 16/324,413

(22) PCT Filed: Aug. 11, 2017

(86) PCT No.: PCT/US2017/046615
§ 371 (c)(1),
(2) Date: Feb. 8, 2019

(87) PCT Pub. No.: WO2018/031942
PCT Pub. Date: Feb. 15, 2018

(65) Prior Publication Data
US 2019/0178964 A1    Jun. 13, 2019

Related U.S. Application Data

(60) Provisional application No. 62/373,497, filed on Aug. 11, 2016.

(51) Int. Cl.
*G01R 33/00*    (2006.01)
*G01R 33/465*    (2006.01)
(Continued)

(52) U.S. Cl.
CPC ........ *G01R 33/465* (2013.01); *G01R 33/448* (2013.01); *G01R 33/56341* (2013.01);
(Continued)

(58) Field of Classification Search
CPC .............. G01R 33/543; G01R 33/5608; G01R 33/4828; G01R 33/3415; G01R 33/283;
(Continued)

(56) References Cited

U.S. PATENT DOCUMENTS 8,380,280 B2 *   2/2013   Basser .............. G01R 33/56341
                                                                324/309
8,874,439 B2    10/2014   Kim et al.
(Continued)

FOREIGN PATENT DOCUMENTS

WO    WO 2015/179049    11/2015

OTHER PUBLICATIONS

Benjamini et al., "Use of marginal distributions constrained optimization (MADCO) for accelerated 2D MRI relaxometry and diffusometry," *Journal of Magnetic Resonance*, 271:40-45 (2016).
(Continued)

*Primary Examiner* — Jermele M Hollington
*Assistant Examiner* — Taqi R Nasir
(74) *Attorney, Agent, or Firm* — Leydig, Voit and Mayer

(57) ABSTRACT

Multi-dimensional spectra associated with a specimen are reconstructed using lower dimensional spectra as constraints. For example, a two-dimensional spectrum associated with diffusivity and spin-lattice relaxation time is obtained using one-dimensional spectra associated with diffusivity and spin-lattice relaxation time, respectively, as constraints. Data for a full two dimensional spectrum are not acquired, leading to significantly reduced data acquisition times.

29 Claims, 10 Drawing Sheets

(51) Int. Cl.
*G01R 33/44* (2006.01)
*G01R 33/563* (2006.01)
*G01R 33/46* (2006.01)
*G01N 24/08* (2006.01)

(52) U.S. Cl.
CPC .......... *G01N 24/08* (2013.01); *G01R 33/4625* (2013.01); *G01R 33/4633* (2013.01)

(58) Field of Classification Search
CPC .... G01R 33/307; G01R 33/60; G01R 33/465; G01R 33/448; G01R 33/56341; G01R 33/00; G01R 33/4625; G01R 33/4633; G01V 3/32; E21B 49/08; E21B 2049/085; G01N 24/10; G01N 24/08
See application file for complete search history.

(56) References Cited

U.S. PATENT DOCUMENTS

| 2007/0083114 | A1 | 4/2007 | Yang et al. | |
|---|---|---|---|---|
| 2017/0089995 | A1* | 3/2017 | Basser | G01R 33/448 |
| 2019/0324102 | A1* | 10/2019 | Hernando | G01R 33/5608 |

OTHER PUBLICATIONS

Burns et al., "Maximum Entropy Reconstruction of Correlated Spectroscopy of Human Breast in Vivo," *Proc. Intl. Soc. Mag. Reson. Med.*, 20:2272 (May 5, 2012).

Chouzenoux et al., "Efficient Maximum Entropy Reconstruction of Nuclear Magnetic Resonance T1-T2 Spectra," *IEEE Transactions on Signal Processing*, 58:6040-6051 (Dec. 2010).

Ge et al., "Joint inversion of $T_1$-$T_2$ spectrum combining the iterative truncated singular value decomposition and the parallel particle swarm optimization algorithms," *Computer Physics Communications*, 198:59-70 (2016).

International Search Report and Written Opinion from International Application No. PCT/US2017/046615, dated Dec. 14, 2017, 17 pages.

Mitchell et al., "Emulation of petroleum well-logging D-$T_2$ correlations on a standard benchtop spectrometer," *Journal of Magnetic Resonance*, 212:394-401 (2011).

Van Beek et al., "Inverse methods in two-dimensional NMR spectral analysis," *Journal of Magnetic Resonance*, 162:141-157 (2003).

IP Australia, Examination Report No. 1 dated Jun. 4, 2022, Australian Patent Application No. 2017310513, 4 pages.

* cited by examiner

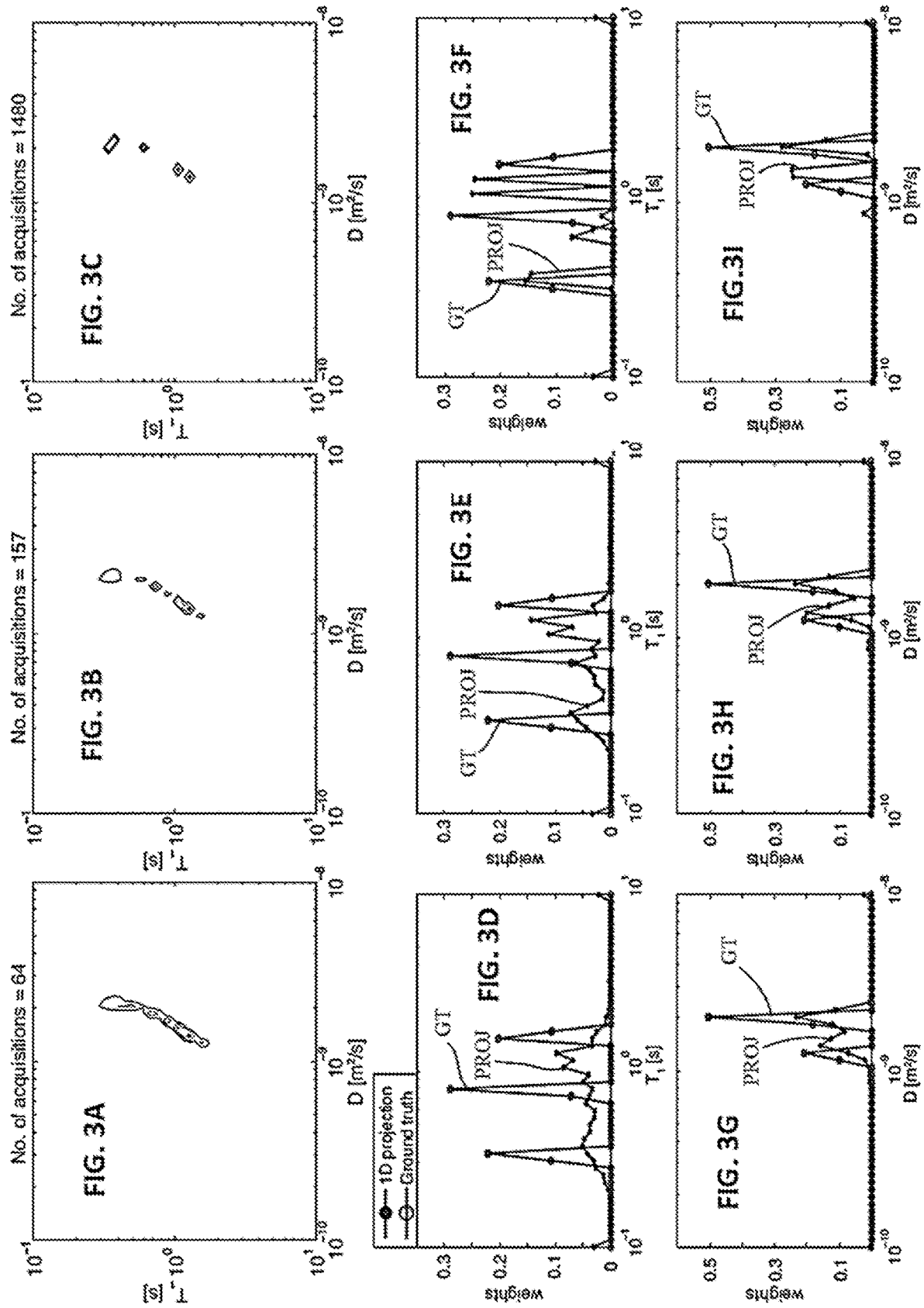

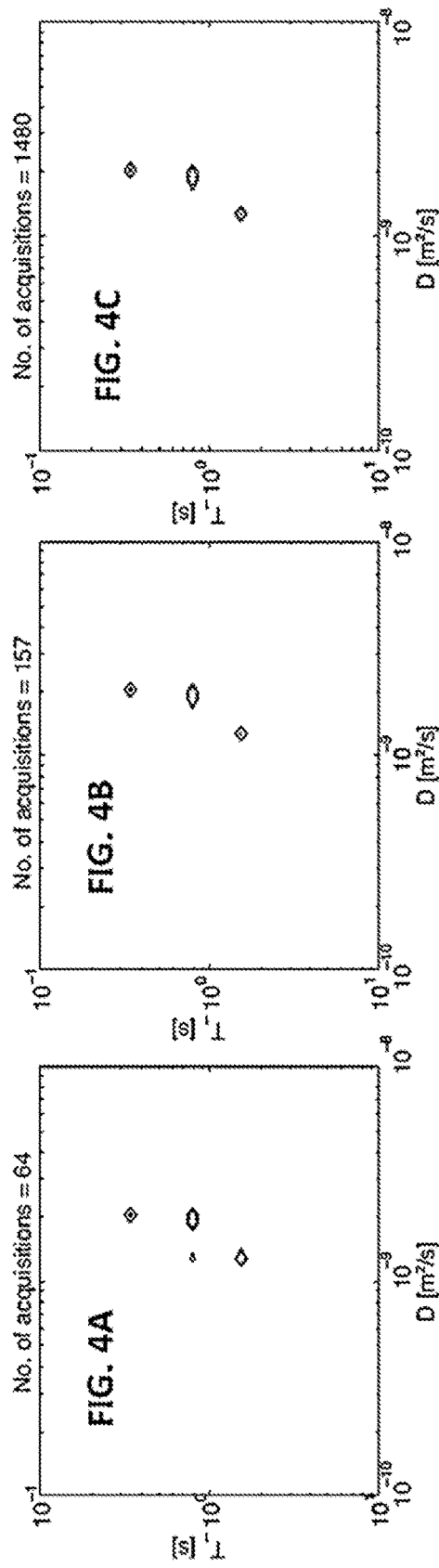
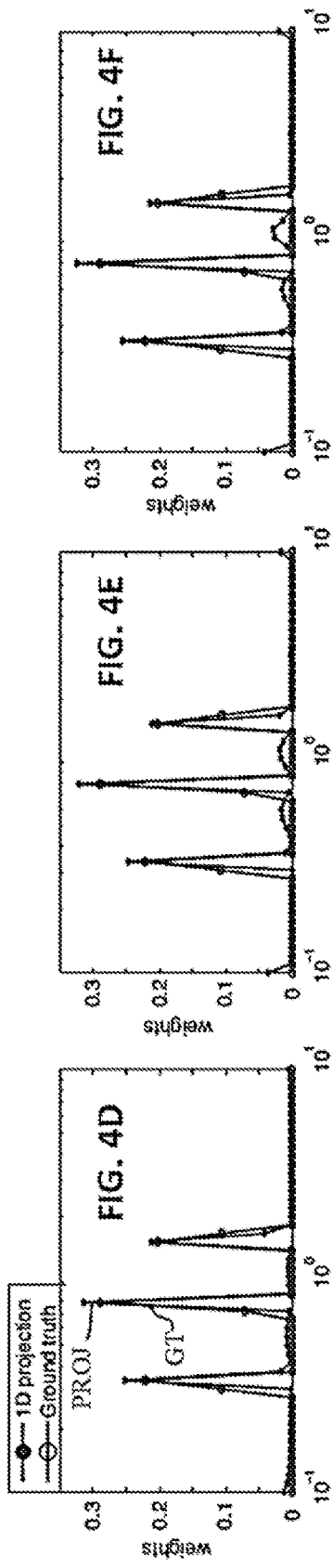
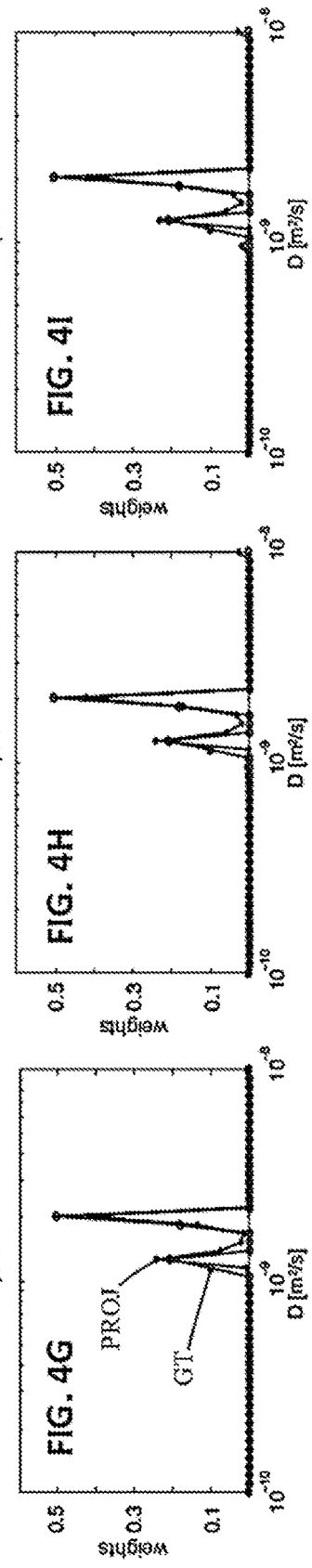

MULTI-DIMENSIONAL SPECTROSCOPIC NMR AND MRI USING MARGINAL DISTRIBUTIONS

CROSS-REFERENCE TO RELATED APPLICATION APPLICATIONS

This is the U.S. National Stage of International Application No. PCT/US2017/046615, filed Aug. 11, 2017, which was published in English under PCT Article 21(2), which in turn claims the benefit of U.S. Provisional Application No. 62/373,497, filed Aug. 11, 2016, which is herein incorporated by reference in its entirety.

STATEMENT REGARDING FEDERALLY SPONSORED RESEARCH AND DEVELOPMENT

This invention was made with Government support under project number HD000266-17 by the National Institutes of Health, National Institute of Child Health and Development. The Government has certain rights in the invention.

FIELD

This disclosure relates to nuclear magnetic resonance and magnetic resonance imaging.

SUMMARY

Measuring multidimensional (e.g., 2D) relaxation spectra in nuclear magnetic resonance (NMR) and magnetic resonance imaging (MRI) clinical applications has numerous applications. NMR and MRI methods and systems are collectively referred to herein as "MR" methods and system. A main bottleneck has been the need for significant computational resources to process large data sets and long acquisition times required to obtain these data sets. Typical methods are based on inversion of Fredholm integrals of the first kind, an ill-conditioned problem requiring large amounts of data to stabilize a solution.

In this disclosure, novel MR methods and approaches are disclosed that can accelerate the acquisition and improve the reconstruction of such 2D spectra using a priori information from 1D projections of spectra, or marginal distributions. In the disclosed approaches, these 1D marginal distributions provide powerful constraints when 2D spectra are reconstructed, and typically require an order of magnitude less data than a conventional 2D approach. The disclosed approaches can be referred to for convenience as marginal distributions constrained optimization (MADCO) methods. In an example, a representative MADCO method is described with reference to a polyvinylpyrrolidone-water phantom that has three distinct peaks in the 2D D-$T_1$ space. The stability, sensitivity to experimental parameters, and accuracy of this new approach are compared with conventional methods by serially subsampling the full data set. While the conventional, unconstrained method performed poorly, the new method is highly accurate and robust, only requiring a fraction of the data. Some aspects of the disclosed technology can also be more generally applied, and may be used with a variety of 2D MRI experiments (D-$T_2$, $T_1$-$T_2$, D-D, etc.), making these potentially feasible for biological, preclinical and clinical applications for the first time.

In some examples, methods comprise acquiring a selected set of MR specimen data by varying at least a first MR acquisition parameter and a second MR acquisition parameter over first and second ranges, respectively, so that the acquired MR specimen data is associated with a first specimen characteristic and a second characteristic. Based on the acquired MR specimen data, a first marginal distribution and a second marginal distribution associated with the first and second specimen characteristics are determined, wherein the first and second marginal distributions are dependent on a selected combination of the first and second MR acquisition parameters. A two-dimensional spectrum associated with the specimen is reconstructed using the first and second marginal distributions as constraints. In some examples, the first marginal distribution and the second marginal distribution are one-dimensional marginal distributions associated with the first MR acquisition parameter and the second MR acquisition parameter, respectively.

In other examples, the first specimen characteristic is $\omega_1$ and the second specimen characteristic is $\omega_2$. The variables $\omega_1$ can be spin-lattice relaxation time ($T_1$), spin-spin relaxation time ($T_2$), transverse relaxation time ($T_2^*$), diffusivity (D), magnetization transfer (MT), or combinations thereof. In still further examples, the first MR acquisition parameter is $\beta_1$ and the second MR acquisition parameter is $\beta_2$. Depending on the measured sample characteristic $\omega_1$, the acquisition parameter $\beta_1$ can be the inversion time $\tau_1$, the echo time $\tau_2$, the diffusion-weighting b-value, and the mixing time $\tau_m$.

In other examples, the first MR acquisition parameter and the second MR acquisition parameter are independent. In other embodiments, the first and second marginal distributions are determined using $\ell_1$ or $\ell_2$ regularization. In further representative examples, the set of MR data to be acquired is selected so as to determine the first and second marginal distributions. In yet other embodiments, the selected set of MR specimen data is a first set of MR data, a second selected set of MR data is acquired, and the first and second marginal distributions are determined based on the first selected set of MR data and the second selected set of MR data. In some examples, at least one computer readable media has stored thereon computer-executable instructions for performing such methods.

In other examples, an MR system comprises an MR data acquisition system and an MR data processor coupled to the MR data acquisition system. The MR data processor is operable to reconstruct two-dimensional MR spectra associated with specimens using first and second marginal distributions as constraints. In some examples, the MR data acquisition system is operable to acquire MR data based on applied MR signals associated with first and second MR acquisition parameters. In representative embodiments, the first and second MR acquisition parameters are operable to produce MR signal variations associated with a first specimen characteristic and a second specimen characteristic. In other embodiments, the MR data acquisition system includes at least a magnet situated to produce a static magnetic field and a radio-frequency pulse generator operable to induce specimen spin rotations. In typical examples, the MR data processor is operable to determine the first and second marginal distributions using $\ell_1$ or $\ell_2$ regularization.

More generally, the disclosed examples can be extended from NMR to MRI examples and applications in which the NMR experiments can be combined with spatial localization or imaging MR sequences to permit this information to be obtained voxel-by-voxel.

The foregoing and other features and advantages of the disclosed technology will become more apparent from the following detailed description, which proceeds with reference to the accompanying figures.

BRIEF DESCRIPTION OF THE DRAWINGS

FIGS. 3A-3I illustrate reconstruction with an unconstrained conventional method. Two data subsamples and the full data set resulted in the 2D D-$T_1$ distributions in 3A, 3B, and 3C, respectively. FIGS. 3D-3I show the 1D projections (full blue circles) overlaid with the ground truth 1D distributions (red empty circles).

FIGS. 4A-4I illustrate reconstruction with a representative MADCO method. Two data subsamples and the full data set resulted in the 2D D-$T_1$ distributions in 4A, 4B, and 4C, respectively. FIGS. 4D-4I show the 1D projections (full blue circles) overlaid with the ground truth 1D distributions (red empty circles).

FIG. 7A shows a marginal $T_1$ distribution and FIG. 7B shows a marginal D distribution, obtained from 1D acquisitions.

DETAILED DESCRIPTION

Introduction

Figure 1:
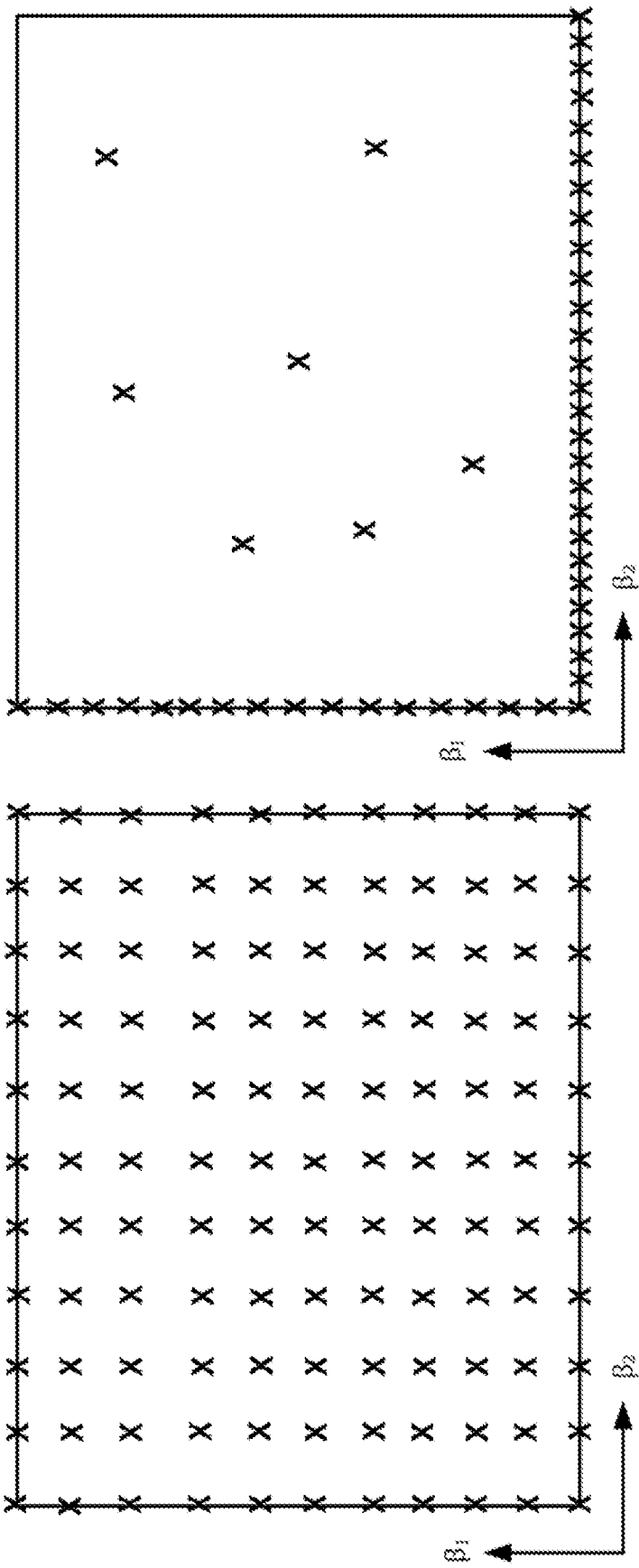
FIGS. 1A and 1B illustrate a conventional scheme (1A) and an exemplary marginal distributions constrained optimization (MADCO) experimental design scheme (1B) used to obtain a 2D correlation function, $F(\omega_1, \omega_2)$.

Multidimensional nuclear magnetic resonance (NMR) experiments allow determination of correlations between relaxation properties such as $T_1$ and $T_2$, and physical parameters, such as diffusivity D. These correlations can be used to identify and characterize microstructure-related water dynamics in many applications. The following general expression describes the received signal M (also commonly referred to as signal attenuation) from 2D NMR experiments associated with sample parameters $\omega_1$, $\omega_2$ with separable kernels:

$$M(\beta_1,\beta_2)=\iint F(\omega_1,\omega_2)K_1(\beta_1,\omega_1)K_2(\beta_2,\omega_2)d\omega_1 d\omega_2 \quad (1)$$

wherein $F(\omega_1, \omega_2)$ corresponds to a sample distribution, $K_1(\beta_1, \omega_1)$ and $K_2(\beta_2, \omega_2)$ are so-called kernels associated with signal dependence on the associated parameters, and flu and $\beta_2$ are experimental parameters that are determined by the data acquisition scheme. Eq. 1 is an example of a broad class of Fredholm integrals of the first kind. When the kernels $K_1$, $K_2$ have an exponential form, application of a 2D inverse Laplace transform (ILT), which is a classic ill-conditioned problem, is required to obtain the sample distribution $F(\omega_1, \omega_2)$. The most common 2D-ILT algorithm used in 2D relaxometry experiments that involve a Carr-Purcell-Meiboom-Gill (CPMG) acquisition requires high density sampling of the received signal. This algorithm can greatly improve the efficiency of the inversion by compressing the 2D signal without losing useful information, revealing a redundancy in some basis representations.

Although multi-dimensional diffusion/relaxation experiments have been of great interest in recent years, preclinical and clinical applications are currently infeasible. In high-field 3T and 7T MRI scanners, the total number of 180° pulses that can be applied per unit time is limited by safety concerns, primarily due to high specific absorption rate (SAR). Fast spin-echo, multi-echo, or CPMG pulse trains are therefore not clinically applicable, and the large amounts of data required cannot be collected in in vivo experiments due to long scan times. Each acquisition, whether D-$T_1$, $T_1$-$T_2$ measurements absent a CPMG pulse train, would result in only a single experimental data point. When a potentially lengthy imaging block is added, shortening the scan time becomes a primary challenge.

Accordingly, in some examples the number of acquisitions needed for an accurate 2D diffusion/relaxation spectrum reconstruction is substantially reduced. One exemplary approach to is to use marginal 1D distributions of the desired 2D function as equality constraints to stabilize and reduce the number of acquisitions needed to invert a discrete Fredholm equation. Applying marginal distributions constrained optimization (MADCO) to multidimensional NMR experiments, 1D projections of a 2D correlation function of two relaxation/diffusion parameters can be used to greatly constrain the solution space of $F(\omega_1, \omega_2)$.

One exemplary measurement and reconstructive approach is illustrated in FIGS. 1A-1B.

Instead of sampling the entire experimental parameter space $\beta_1,\beta_2$ (FIG. 1A) and estimating the 2D distribution $F(\omega_1, \omega_2)$, using the exemplary MADCO approach illustrated in FIG. 1B, the 2D distribution can be estimated accurately with a relatively dense sampling along $\beta_1$ and $\beta_2$ axes (i.e., 1D data), complemented with a small number of acquisitions in the 2D space. The 2D reconstruction then typically comprises two steps: (1) estimating $F(\omega_1)$ and $F(\omega_2)$ from the 1D data, and then (2) using these 1D spectra to constrain the estimation of $F(\omega_1, \omega_2)$ from the remaining 2D data.

Typically, to obtain multi-dimensional spectra of particular specimen characteristics (such as D and $T_1$) associated NMR signal acquisition parameters such as gradient strength G (or equivalently, b-value) and inversion time ti are varied to provide one dimensional spectra. In some examples, one dimensional spectra are obtained with one or both of the NMR signal acquisition parameters set to a fixed value that substantially reduces or eliminates NMR acquired signal dependence on the corresponding specimen characteristic. For example, as discussed below, gradient strength can be set to 0 or otherwise made small, and inversion time can be very long with respect to specimen $T_1$ values. Although not as straightforward, NMR signals that are dependent on combinations of specimen characteristics can be obtaining using different combinations of the associated acquisition parameters. For example, different combinations of b-values and inversion times τ can be applied such as, for example, linearly independent combinations of acquisition parameters such as Ab+Bτ and Ab−Bt, wherein A, B are arbitrary numbers. The corresponding one-dimensional spectra are then associated with these combined characteristics and can be used to constrain multi-dimensional spectra. In other examples, arbitrary sets of acquired data are used to produce one-dimensional spectra. Although not discussed in detail, multi-dimensional spectra of a lower order can be used to constrain the determination of higher order multi-dimensional spectra. For example, a one dimensional spectrum and a two dimensional spectrum can be used to constrain a three dimensional spectrum. Thus, two lower order spectrum associated with n specimen characteristics and m specimen characteristics, respectively, can be used to find an n+m spectrum.

Although the disclosed methods can be equivalently applicable to other types of multidimensional experiments, for convenient illustration, D-$T_1$ measurements of a polyvinylpyrrolidone (PVP) water solution phantom are described herein. A clinically applicable inversion recovery diffusion-weighted imaging pulse sequence was used to observe D-$T_1$ correlations. The disclosed and conventional approaches were investigated to determine the stability, sensitivity to experimental parameters, and accuracy of both methods were explored by incrementally decreasing the number of acquisitions by subsampling a full data set.

Sample Preparation and Data Acquisition

Figure 2:
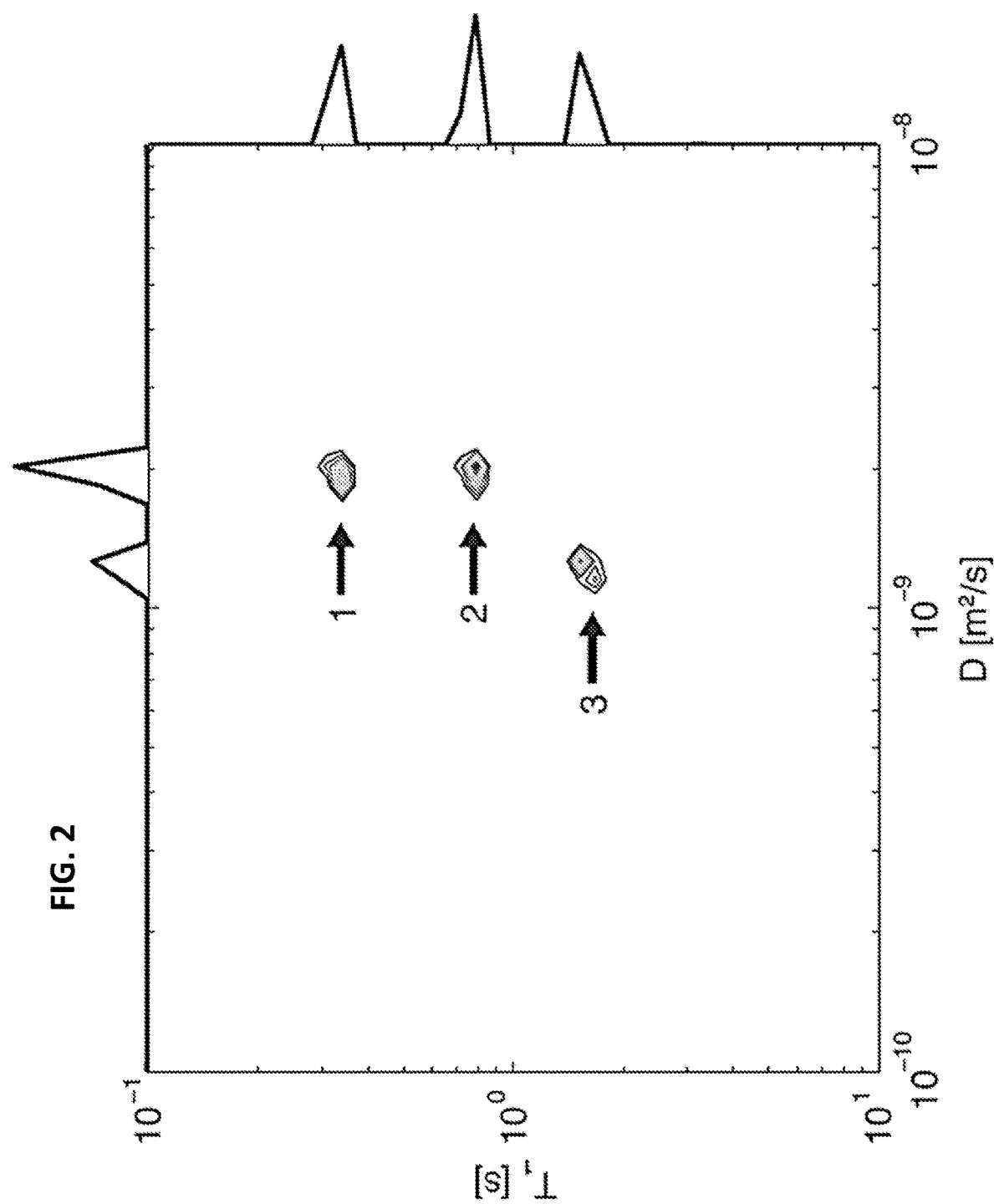
FIG. 2 shows a ground truth $T_1$-D distribution obtained from a separate analysis of each ($T_1$, D) sample and averaging according to the relative spin density. The three peaks are identified and numbered (1, 2, 3) for reference, and their (gm$T_1$, gmD) values were 1. (293 ms, 2.26µ$^2$/ms); 2. (782 ms, 1.99µ$^2$/ms); and 3. (1596 ms, 1.24µ$^2$/ms).

Doped water and polyvinylpyrrolidone PVP (Sigma-Aldrich, K value 29-32) were used to create a D-$T_1$ phantom with three distinct peaks. Aqueous solutions of PVP were shown to make good diffusion MR phantoms since their measured diffusivity is independent of the diffusion time, indicating Gaussian diffusion of a single population of spins. In addition, increasing PVP weight per volume (w/v) concentration is negatively correlated with both the diffusivity and $T_1$. Two purified water samples with 0.18 mM and 0.5 mM gadopentetate dimeglumine were prepared, along with a 20% w/v PVP water solution sample. The corresponding weighted geometric means (gm) of the relaxation times and diffusivities (gm$T_1$, gmD), as measured separately for each sample are shown in FIG. 2. Each sample was placed in a 4 mm NMR tube; these were then inserted together into a 15 mm NMR tube.

Imaging data were collected on a 7 T Bruker wide-bore vertical magnet with an AVANCE III MRI spectrometer equipped with a Micro 2.5 microimaging probe. MRI data were acquired with an inversion recovery spin-echo diffusion-weighted echo planar imaging (IR-DWI-EPI) sequence, with an adiabatic 180° inversion pulse applied before the standard spin-echo diffusion weighted sequence. The full 2D experimental set had 40 diffusion gradient linear steps (G) ranging from 0 to 900 mT/m, 37 inversion times ( ) with logarithmic temporal spacing ranging from 100 to 3000 ms, and an additional magnetization equilibrium scan with an inversion time of 10 s. The 1D experiments were a subset of the full 2D data set. The 1D IR data set included all of the 37 inversion times with G=0, and the 1D diffusion data set included all of the odd diffusion gradient linear steps (total of 20) with z=10 s. Other acquisition parameters were diffusion gradient duration and separation of δ=3 ms and Δ=15 ms, respectively, leading to a b-value range of 0 to 6200 s/mm$^2$ (b=$\gamma^2\delta^2G^2(\Delta-\delta/3)$), where γ is the gyromagnetic ratio, TE=50 ms, and TR=inversion time+10 s. A single 5 mm axial slice with a matrix size and resolution of 64×64 and 0.2×0.2 mm, respectively, was acquired with two averages and four segments. The experimental signal-to-noise ratio (SNR) in the full 2D experiment was ~700.

Methods

For D-$T_1$ measurements, for a given recovery time the fully recovered data are subtracted from the data set so that the potential artifacts caused by imperfect inversion pulses are cancelled. Eq. 1 (above) can be discretized by using the kernels $K_1$ (τ, $T_1$) and $K_2$(b,D), with $N_{T1}$ and $N_D$ log-spaced values of $T_1$ and D, respectively, and $N_\tau$ and $N_b$ values of τ and b, respectively:

$$M(\tau, b) = \sum_{n=1}^{N_{T_1}} \sum_{m=1}^{N_D} F(T_{1,n}, D_m)\exp\left(-\frac{\tau}{T_{1,n}}\right)\exp(-bD_m) \quad (2)$$

wherein $F(T_{1,n},D_m)$ is a discretized sample density and the 2D kernel, $K(\tau, b, T_1, D)=K_1(\tau, T_1)K_2(b,D)$. Eq. 2 can be written in matrix form as:

$$M=KF, \quad (3)$$

where M and F are ($N_\tau N_b$)×1 and ($N_{T1}N_D$)×1 vectors, and K is an ($N_\tau N_b$)×($N_{T1}N_D$) matrix. As discussed, Eq. 3 represents an ill-conditioned problem, i.e., a small change in M may result in large variations in F. One approach to solving such ill-conditioned problems is regularization. If a solution is expected to be smooth, $\ell_2$ regularization is appropriate. However, in this example the phantom comprises discrete components in D-$T_1$ space, making $\ell_1$ regularization a more suitable choice since it has many of the beneficial properties of $\ell_2$ regularization, but yields sparse models (see "Marginal Distributions Constrained Optimization (MADCO) for Accelerated 2D MRI Relaxometry" below). The regularized problem considered in this example was:

$$F^{(\alpha)}=\mathrm{argmin}_{F\geq 0}(\|KF-M\|_2^2+\alpha\|F\|_1^2) \quad (4)$$

wherein $\| \ldots \|_2$ and $\| \ldots \|_1$ are $\ell_2$ and $\ell_1$ norms, respectively, and a regularization parameter a was chosen based on an S-curve method, which uses a fit error, $\chi(\alpha)=\|KF^{(\alpha)}-M\|_2$. The regularization parameter was determined such that d(log χ)/d(log α)=TOL, with TOL=0.1.

The disclosed approach provides simple and elegant ways to stabilize the solution of Eq. 4, while significantly reducing the number of required data acquisitions (i.e., to reduce $N_\tau$ and $N_b$) and improving accuracy. Since $F(T_1, D)$ is the joint distribution of $T_1$ and D, it is related to the 1D marginal distributions $F(T_1)$ and $F(D)$ by $$\sum_{n=1}^{N_D} F(T_1, D_n) = F(T_1) \text{ and } \sum_{n=1}^{N_{T_1}} F(T_{1,n}, D) = F(D). \quad (5)$$

The 1D marginal distributions, $F(T_1)$ and $F(D)$, can be separately estimated from 1D inversion recovery or diffusion experiments, respectively, and then used to find $F(T_1, D)$ by applying the two parts of Eq. 5 as equality constraints when Eq. 4 is solved. The 1D problems, in which Eq. 4 is solved by replacing the ($N_\tau N_b$)×($N_{T1}N_D$) kernel K with $N'_\tau \times N_{T1}$ kernel $K_1$ or $N'_b \times N_D$ kernel $K_2$ ($N'_\tau$ and $N'_b$ are the number of 1D acquisitions), reduce the number of free parameters by a factor of $N_D$ and $N_{T1}$, respectively.

Using MADCO is shown here to dramatically reduce the number of 2D experiments required to estimate the 2D distribution, such that $N_\tau \ll N'_\tau$ and $N_b \ll N'_b$. These equality constraints should be relaxed when experimental noise is expected to result in inaccurate $F(T_1)$ and $F(D)$ estimations. In this case the constraints are $$\frac{1}{N_D} \left\| \sum_{n=1}^{N_D} F(T_1, D_n) - F(T_1) \right\|_2 < \sigma \tag{6}$$

and $$\frac{1}{N_{T_1}} \left\| \sum_{n=1}^{N_{T_1}} F(T_{1,n}, D) - F(D) \right\|_2 < \sigma, \tag{7}$$

where $\sigma$ is the standard deviation (SD) of the noise (as determined after complete signal decay) normalized by the unattenuated signal. Similarly to the standard non negativity constraints, the inequality constraints in Eqs. 6 and 7 also represent physical conditions that must be fulfilled ("conservation of mass" of the 2D probability distribution projected onto one of its axes), and can be applied in a similar manner. In the disclosed example, $N_{T_1} = N_D = 50$, $N'_\tau = 37$, $N'_b = 20$, and the number of 2D experiments $(N_\tau N_b)_{were}$ varied in the range of 7 to 1480, while stability and accuracy were quantified.

Imaging the phantom enabled separate analysis of each of the $(T_1, D)$ samples by the selection of three regions of interest (ROI). Solving Eq. 6 using the full 2D dataset and the 1D subsets resulted in estimations of $F_{GT}(T_1, D)$, $F_{GT}(T_1)$, and $F_{GT}(D)$, (GT stands for ground truth) from these ROIs, separately. Estimating the spectra of a single peak data (i.e., monoexponential) is a well-posed problem, and therefore the 1D and 2D distributions obtained from these analyses were averaged according to their relative spin density and taken as the ground truth (FIG. 2 for a 2D distribution, and FIG. 6 for a 1D distribution). Performance was assessed by computing the Jensen difference, which is a measuring of distance between two probability distributions. The Jensen difference $d_{JD}$ is a symmetric version of the Kullback-Leibler divergence that is bounded by 0 and 1 and is defined for two distributions, $Q$ and $P$, as:

$$d_{JD} = \sum_i \left[ \frac{P_i \ln(P_i) + Q_i \ln(Q_i)}{1} - \left( \frac{P_i + Q_i}{2} \right) \ln\left( \frac{P_i + Q_i}{2} \right) \right]. \tag{8}$$

Results

The performance of MADCO was determined and compared with the conventional method by estimating the $D$-$T_1$ distribution by using 500 random subsamples from the full data set at 19 logarithmically distributed acquisitions. Reconstruction using the conventional experimental design (FIG. 1A) at three representative data subsamples—64, 157, and 1480 acquisitions—resulted in the 2D D-$T_1$ distributions shown in FIGS. 3A-3C, respectively. In FIGS. 3D-3I, for each 2D distribution the 1D projections are overlaid with the ground truth. Visually compared with the ground truth in FIG. 2, the estimated results in FIGS. 3A-3I are highly inaccurate, both for the 2D and 1D projections; furthermore, they remain poor even when the full data set is used (1480 acquisitions).

Spectra reconstructed using the MADCO experimental design (FIG. 1B) and processing framework at the same three data subsamples (in this case 7, 100, and 1423 2D acquisitions along with 20 and 37 1D diffusion (O) and IR ($T_1$) acquisitions, respectively, totaling 64, 157, and 1480 acquisitions) are shown in FIGS. 4A-4I. Stability, as well as accuracy, are evident from the 2D distributions, in which little to no difference was noted as the number of acquisitions was increased by a factor of 25 (FIGS. 4A-4C). The marginal $T_1$ and D distributions were more accurate at 157 acquisitions (FIGS. 4E and 4H) than with the full data set. This observation can be attributed to the nonuniform (sub) sampling, which is known to yield an increase in SNR. In terms of establishing the peaks (mean and amplitude) accuracy, MADCO outperformed the conventional method in almost every instance, while consistently keeping the normalized root mean square error well-below 10%. A more complete list of parameters and details regarding the error computation are provided in Tables 1 and 2 below.

Figure 5A:
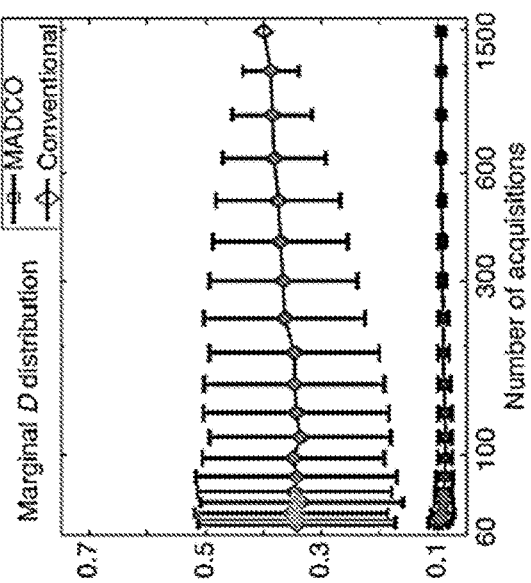
FIGS. 5A-5C illustrate the accuracy and stability typical of the disclosed methods demonstrated by the Jensen difference between estimated and ground truth distributions, with the conventional (green diamonds) and MADCO (blue squares) methods, as a function of the number of acquisitions. Measured distances of the 2D D-$T_1$ distribution, and projections of the $T_1$ and D distributions, are shown in FIG. 5A, FIG. 5B, and FIG. 5C, respectively.
Figure 5B:
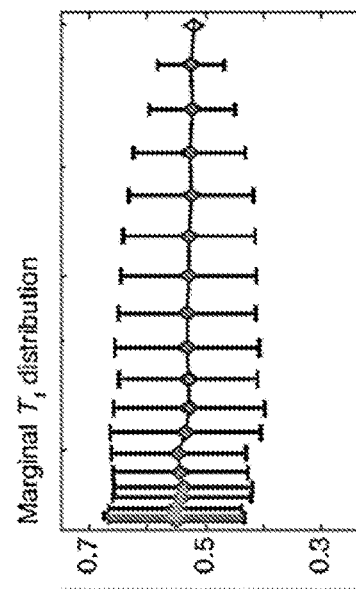
Figure 5C:
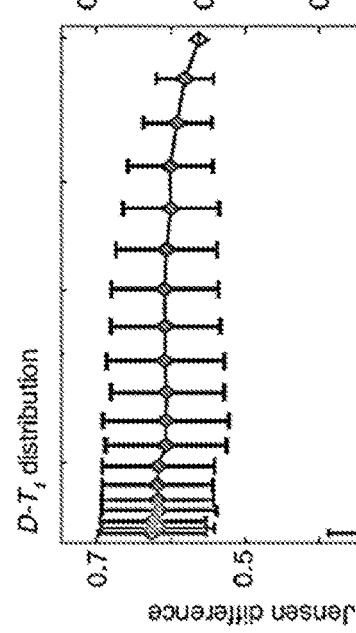

As opposed to single parameters (e.g., gm$T_1$, gmD) accuracy, it is more informative to study the accuracy of the entire reconstructed 2D distribution as a function of the number of acquisitions. Jensen differences between the estimated and the ground truth distributions were calculated after reconstruction of the 2D distributions with and without MADCO. For each number of acquisitions, averages and Standard Deviations (SDs) of the 2D Jensen differences from the 500 random subsamples were computed and are presented in FIGS. 5A-5C. Both the Jensen difference between the 1D projections of the $T_1$ and D distributions and the ground truth are shown in FIGS. 5B and 5C, respectively. The high accuracy of MADCO reconstruction is demonstrated by its markedly low Jensen difference from the ground truth, compared with results from the unconstrained approach. The stability of MADCO is evident from the relatively small SD and its low variability. Conversely, the conventional method resulted in a large SD that points to a high degree of sensitivity to experimental parameters that was mitigated by using MADCO. It is worth noting that in some cases the Jensen distance of the projected distributions did not always monotonically decrease as a function of increased number of acquisitions. In both cases, however, the 2D Jensen distance exhibited a monotonic decrease.

DISCUSSION

Despite the ill-conditioned nature of the numerical inversion of the Fredholm integrals of the first kind, this problem is at the heart of many applications. The resultant data bottleneck in many areas that require a large number of experiments and samples has made many applications impractical or infeasible. For example, although 2D NMR experiments are very powerful, because of the long acquisition time required to obtain sufficient data to invert the Fredholm equation, these experiments have not been migrated to in vivo preclinical or clinical MRI applications. The technology described herein can stabilize, accelerate, and improve the reconstruction of a 2D spectrum by using the more easily accessible knowledge about its 1D projections. MADCO uses a general mathematical approach for improving the properties of ILT and has been demonstrated here on a D-$T_1$ phantom sample comprised of three distinct peaks in a 2D space. As shown, provided a reasonably accurate estimation of the 1D marginal distributions, constraining Eq. 4 with the inequalities in Eqs. 6 and 7 resulted in a high level of accuracy while using a fraction of the full data set. The efficiency of MADCO can be expressed by considering the number of dimensions, N, and the number of acquisitions required to reconstruct the 1D spectrum in a given dimension, M. A conventional approach requires $O(M^N)$ measurements, while using MADCO only $O(MN)$ acquisitions are needed.

Figure 6:
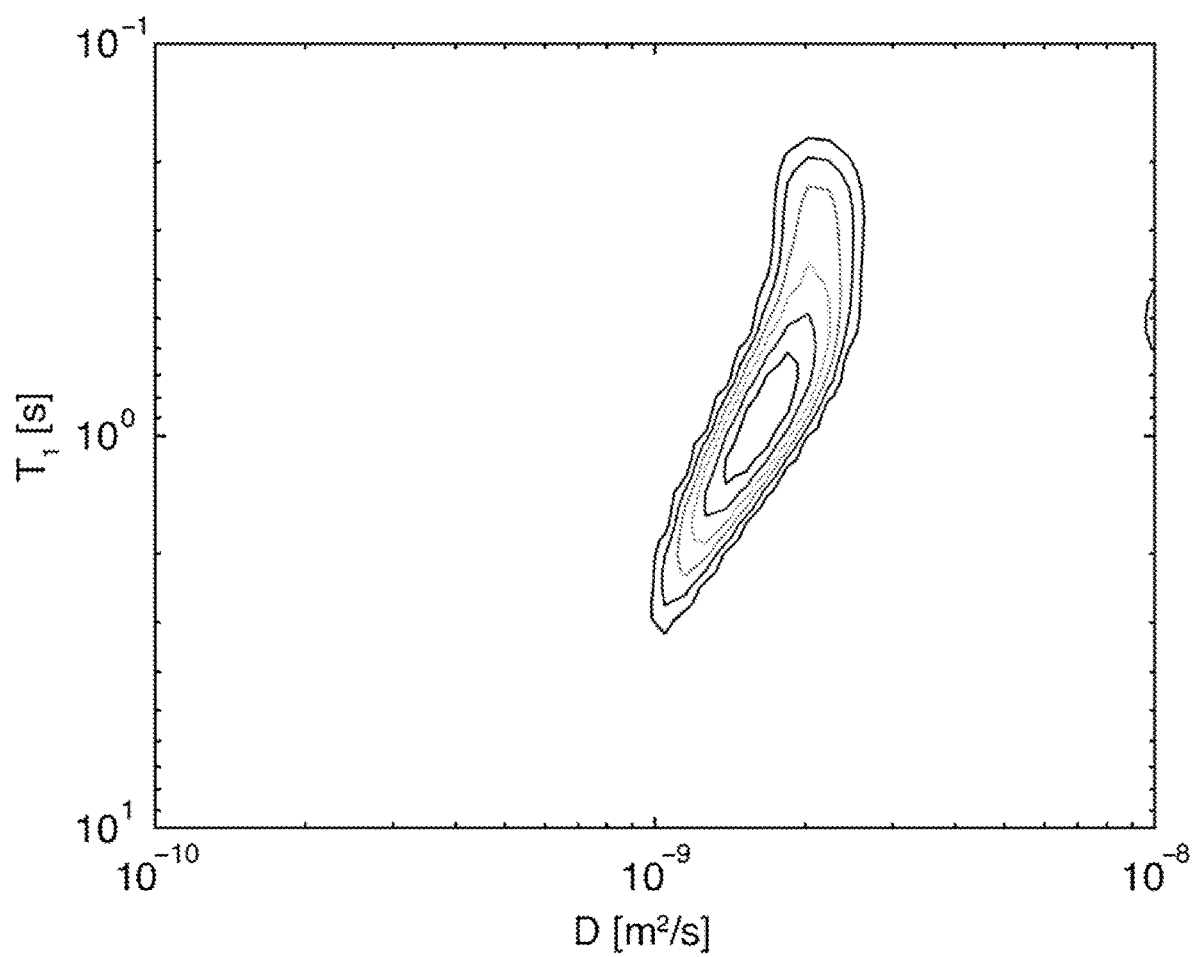
FIG. 6 shows the $T_1$-D distribution with $\ell_2$ regularization using a conventional method on a full data set.

The independent 1D measurements resulted in highly accurate marginal distributions, even for the demanding three-peak 1D $T_1$ distribution (see FIG. 6). The 1D projections from the conventionally obtained 2D distributions (FIGS. 3D-3I) were inaccurate and not robust, especially in resolving the more challenging $T_1$ distribution. The surprising results disclosed herein are in contrast to published reports which state that recovering a 1D relaxation distribution by first performing a 2D relaxometry experiment followed by projection is more accurate and reliable than 1D relaxometry. However, prior approaches have failed to recognize that $\ell_2$ norm regularization is unsuitable, particularly for analyzing data acquired from phantoms comprised discrete components in a 2D parameter space.

Purposely oversampled, the full acquisition scan time was ~37 h. As shown, the D-$T_1$ distribution estimated with the conventional method was far from accurate, even when the full data set was used. Conversely, applying the disclosed methodology led to good agreement with the ground truth distribution, even when using only 4% of the full data set (64 acquisitions). Furthermore, additional acquisitions may still be necessary to improve the accuracy of the conventional approach leading to further convergence in the Jensen distance shown in FIG. 5A. Since convergence was not reached, it is difficult to establish the true acceleration factor of MADCO although it is logically greater than 1480/64≈25. In the disclosed example 64 acquisitions~90 min scan times were sufficient for a complete D-$T_1$ distribution mapping using the MADCO method. Although a phantom was selected for convenient illustration study, an IR-DWI-EPI pulse sequence was used which can be directly applied to in vivo preclinical and clinical studies. The conservatively chosen repetition time used in this example (10 s) could be reduced. Further acceleration can be achieved by using a Look-Locker acquisition for $T_1$-weighting, or modified versions thereof. Recent advances in sampling strategies, such as compressed sensing for relaxometry parameter space, may also be integrated with the MADCO method to increase 2D acquisition efficiency.

Among other biological applications, characterization of nerve tissue with 2D diffusometry/relaxometry MRI may be able to reveal otherwise inaccessible information. Preliminary findings from D-$T_1$ MRI experiments on nerve tissue analyzed with MADCO indicate sensitivity to microstructural features and complex water exchange dynamics, such molecular exchange dynamics. The disclosed technology can also provide a comprehensive investigation in a reasonable time frame by using the MADCO method in conjunction with a variety of other 2D experiments, such as D-$T_2$ and $T_1$-$T_2$ correlation and $T_2$-$T_2$ and D-D exchange studies. Furthermore, the disclosed technology may be extended beyond 2D, since application of the marginal distributions constrained optimization principle in higher dimensions enables the main limitation of experimental time to be lifted.

Use of Marginal Distributions Constrained Optimization (MADCO) for Accelerated 2D MRI Relaxometry Using $\ell_2$ Regularization When a spectrum is expected to be smooth, $\ell_2$ regularization is appropriate. However, in the disclosed example, the phantom comprises discrete components in D-$T_1$ space, making $\ell_1$ regularization a more suitable choice since it has many of the beneficial properties of $\ell_2$ regularization, but yields sparse models. To illustrate, $\ell_2$ regularization was employed on the full data set (1480 acquisitions) using the conventional method. The resulting spectrum is shown in FIG. 6.

Ground Truth and Estimations from 1D Experiments

Figure 7A:
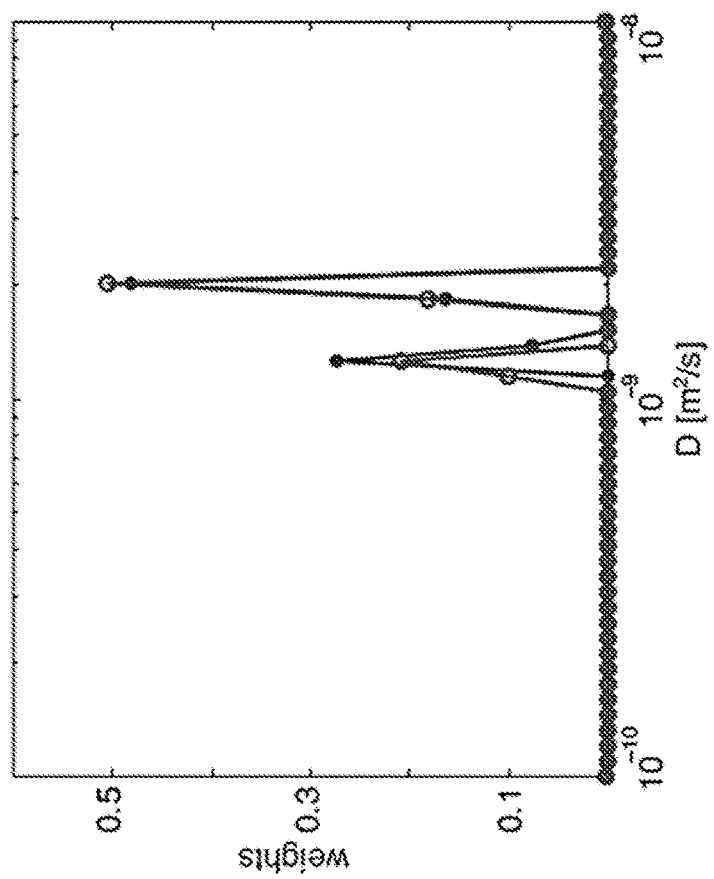
FIGS. 7A and 7B are graphs showing comparison between ground truth (empty red circles) and estimations from 1D experiments (full blue circles).
Figure 7B:
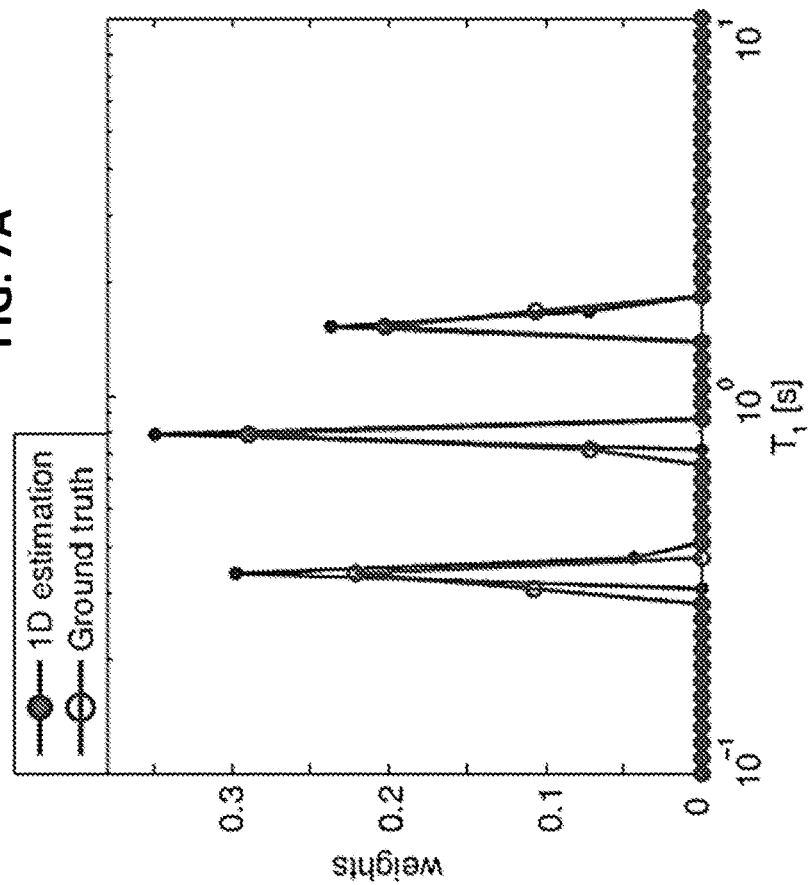

Imaging the phantom allowed separate analysis of each of the ($T_1$, D) samples by selecting 3 regions of interest (ROI). The single peak 1D distributions obtained from separately analyzing these ROIs using data from 1D experiments were then averaged according to their relative spin densities and taken as the 1D ground truth (shown in FIGS. 7A-7B). The marginal $T_1$ and D distributions from a ROI that included all three ($T_1$, D) samples using 1D experiments are shown in FIGS. 7A-7B, respectively. These 1D estimations were used to constrain the 2D D-$T_1$ distribution reconstruction, resulting in a stabilization and acceleration.

Accuracy of the 2D Distribution Derived Parameters

The accuracy of the estimated parameters, D-$T_1$, and the height of each peak, F, in the obtained 2D distributions, was determined by computing their normalized root mean square error (nrmse), E, relative to the ground truth values (shown in Table 1 below), wherein $$\epsilon = \frac{\sqrt{\langle(\text{Estimated value} - \text{True value})^2\rangle}}{\text{True value}} \times 100,$$

where $\langle \ldots \rangle$ represents the geometrical mean (gm). The MADCO approach outperformed conventional methods in almost every instance, while consistently keeping E well-below 10%.

The nrmse values of single parameters from the distribution may be misleading. For example, the nrmse associated with the first two peaks in the spectrum obtained by using the conventional method with 64 acquisitions points to reasonable accuracy (see Table 1 below)—while examination of the actual 2D spectrum (FIG. 3A) clearly shows that these peaks are not even resolved.

The actual estimated parameters, gmD, gm$T_1$, and the height of each peak F were determined by averaging over sections in the 2D distributions that correspond to the three distinct peaks. The partition between the peaks was determined according to the ground truth distribution (FIG. 1): (1) 100≤$T_1$≤494 ms; (2) 543≤$T_1$≤954 ms; (3) 1048≤$T_1$≤10000 ms. Note that the entire range of diffusivities was included in each peak. The resulting parameters are detailed in Table 2 below.

TABLE 1

Accuracy of the estimated 2D distribution derived parameters for the MADCO and convention methods at different number of acquisitions. The nrmse [%] pf the gm$T_1$, gmD, and F estimates of each peak relative to the ground truth values are expressed as $E_{T_1}$, $E_D$, and $E_F$, respectively.

| Peak | | 64 Acq. MADCO/Conv. | 157 Acq. MADCO/Conv. | 1480 Acq. MADCO/Conv. |
|---|---|---|---|---|
| 1 | $\epsilon_{T_1}$ | 3.7/7.6 | 0.4/4.3 | 0.7/5.9 |
|   | $\epsilon_D$ | 8.8/1.5 | 0.8/2.0 | 2.9/4.3 |
|   | $\epsilon_F$ | 4.8/1.1 | 8.4/6.1 | 8.6/1.7 |

TABLE 1-continued

Accuracy of the estimated 2D distribution derived parameters for the MADCO and convention methods at different number of acquisitions. The nrmse [%] pf the gmT$_1$, gmD, and F estimates of each peak relative to the ground truth values are expressed as E$_{T1}$, E$_D$, and E$_F$, respectively.

| Peak | | 64 Acq. MADCO/Conv. | 157 Acq. MADCO/Conv. | 1480 Acq. MADCO/Conv. |
|---|---|---|---|---|
| 2 | $\epsilon_D$ | 9.1/6.8 | 6.2/2.7 | 3.6/14 |
|   | $\epsilon_F$ | 0.1/25 | 8.9/31 | 6.1/63 |
| 3 | $\epsilon_{T_1}$ | 12/9.2 | 2.9/12 | 1.1/18 |
|   | $\epsilon_D$ | 13/29 | 2.3/11 | 2.3/14 |
|   | $\epsilon_F$ | 5.4/30 | 5.4/43 | 2.9/75 |

TABLE 2

Accuracy of the estimated 2D distribution derived parameters for the MADCO and conventional methods at different number of acquisitions.

| | | Truth | 64 Acq. MADCO | 64 Acq. Conv. | 157 Acq. MADCO | 157 Acq. Conv. | 1480 Acq. MADCO | 1480 Acq. Conv. |
|---|---|---|---|---|---|---|---|---|
| Peak 1 | gmT$_1$ [ms] | 293 | 304 | 316 | 292 | 306 | 291 | 311 |
| | gmD [µm$^2$/ms] | 2.26 | 2.06 | 2.23 | 2.25 | 2.22 | 2.20 | 2.17 |
| | F | 0.35 | 0.33 | 0.34 | 0.32 | 0.33 | 0.32 | 0.34 |
| Peak 2 | gmD [µm$^2$/ms] | 1.99 | 1.81 | 1.86 | 1.87 | 1.94 | 1.92 | 2.27 |
| | F | 0.35 | 0.35 | 0.26 | 0.38 | 0.24 | 0.37 | 0.13 |
| Peak 3 | gmT$_1$ [ms] | 1596 | 1785 | 1449 | 1643 | 1406 | 1613 | 1307 |
| | gmD [µm$^2$/ms] | 1.24 | 1.39 | 1.36 | 1.26 | 1.37 | 1.26 | 1.41 |
| | F | 0.30 | 0.32 | 0.40 | 0.30 | 0.43 | 0.31 | 0.53 |

Measuring Molecular Exchange

The disclosed technology can also be used to probe dynamic migration of water from one domain to another, referred to as molecular exchange. Rather than impose unsupported assumptions about the number of exchanging compartments, the disclosed technology provides a model-free approach to measure exchange, allowing for any number of exchange processes between any number of compartments. This fast diffusion exchange spectroscopy (fDEXSY) MRI method provides a framework to obtain such information, which can be translated into cell membrane permeability, in a clinically feasible time frame.

Other Exemplary Applications of Technology

The disclosed technology can be in clinical MRI scanners, and can be used to perform in vivo microdynamic MRI scans. The different microdynamic biomarkers can alter significantly with brain tissue viability. Particularly useful applications of microdynamic MRI include examining changes in inflammation, cancer, and stroke. Other applications include investigating neuroplasticity in normal development and learning. Because the main processes during neuroplasticity include induction of long-term potentiation, neurogenesis, and structural remodeling of various cellular and subcellular components, the specificity and sensitivity of microdynamic MRI to nervous tissue component density and exchange make it an excellent exploratory tool. MRI tools based on the disclosed technology can also be applied to normal and injured ex vivo tissue samples to measure the exchange with acquired high resolution and high quality MRI data. Quantitative histology and immunohistochemistry can then be performed on the same spinal cord and brain tissue specimens for direct comparison of the distribution of various tissue stains with MRI-based permeability maps.

The disclosed methods and apparatus can be applied in whole-body image applications to scan organs including but not limited to the heart, placenta, liver, kidneys, spleen, colon, prostate, as well as skeletal and other muscles and peripheral nerves. The disclosed approaches can also be used in genotype/phenotype and other studies using vertebrates and other animal models as well as with non-biological materials, including foods, organic and synthetic polymers and gels, separation systems used in chemical engineering applications, soil and other samples, clay and rock, and other porous and non-porous media. The disclosed methods and apparatus can be applied to ex vivo and in vitro applications to evaluation of specimens such as animals, plants, micro-organisms, or other organisms, or selected organs or other portions of such organisms.

In other applications, the disclosed methods and apparatus can be used in studying abnormal and normal developmental trajectories as well as a variety of disorders, diseases and sequelae of trauma, including mild traumatic brain injury, to follow and assess inflammatory responses in soft tissues, including the brain, in which immune and other cells may infiltrate into the extracellular matrix (ECM), and in evaluating and tracking wound healing and other time dependent cellular and tissue processes. As noted above, the disclosed methods and apparatus can also be used to study development of other tissues and organs in humans or animals or other living organisms either ex vivo or in vivo as well as non-biological specimens.

While examples of the disclosed technology are generally discussed with reference to magnetic resonance imaging (MRI), the disclosed approaches can also be used in nuclear magnetic resonance (NMR) generally, or any magnetic resonance based specimen evaluation, with or without image acquisition.

Additional information regarding the disclosed technology and its possible application can be found in Bai R, Benjamini D, Cheng J, and Basser P J: "Fast, accurate 2D-MR relaxation exchange spectroscopy (REXSY): beyond compressed sensing," published in The Journal of Chemical Physics, 145:154202, 2016; and in Benjamini D and Basser P J: "Towards clinically feasible relaxation-diffusion correlation MRI using MADCO," published in Microporous and Mesoporous Materials, 2017, 10.1016/j.micromeso.2017.02.001; both of which are incorporated herein by reference in their entireties.

Signal Acquisition

Figure 8:
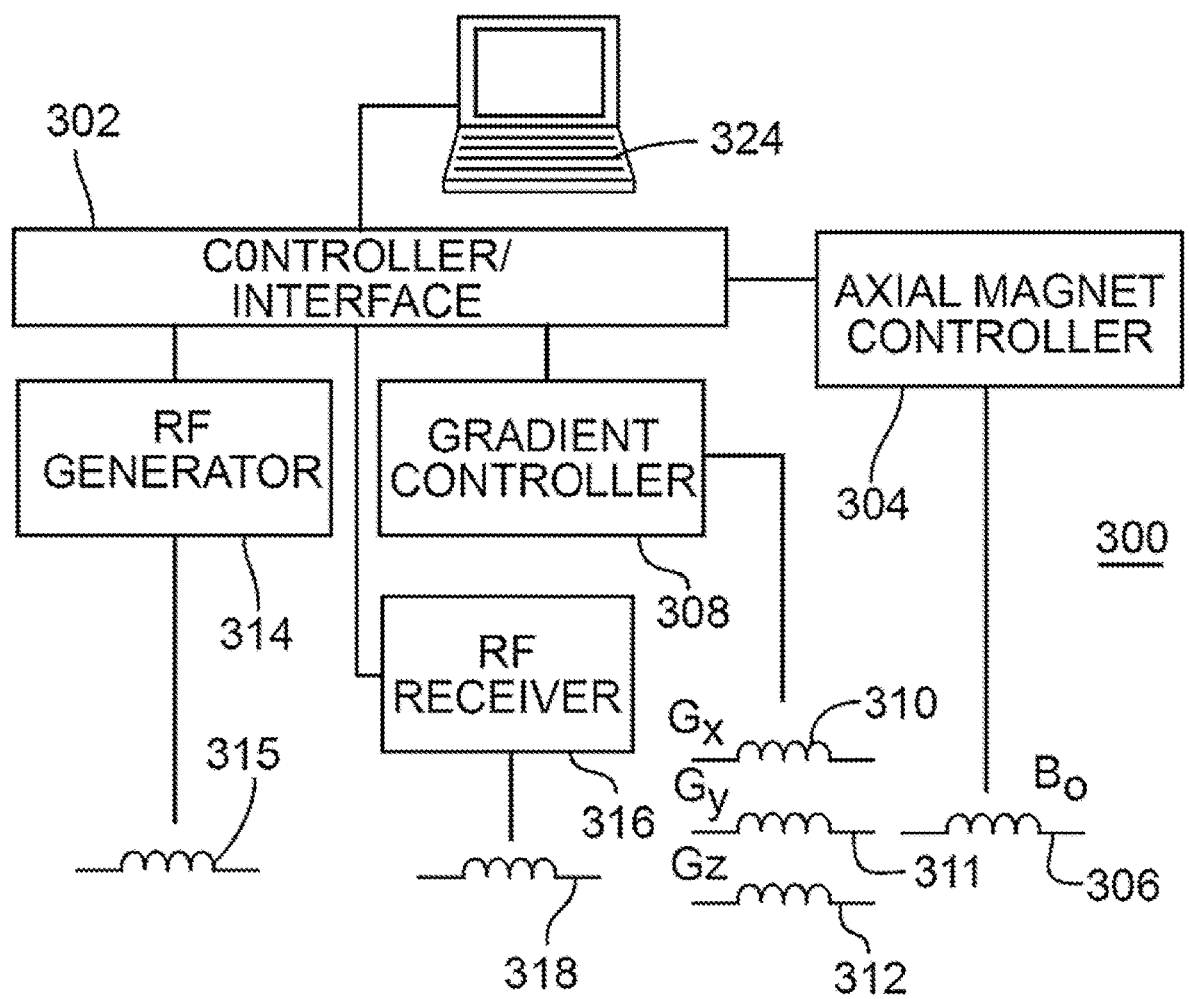
FIG. 8 is schematic illustration of an exemplary magnetic resonance apparatus.

NMR signals as described herein can be obtained using an exemplary NMR/MRI apparatus 300 as illustrated in FIG. 8.

The apparatus 300 includes a controller/interface 302 that can be configured to apply selected magnetic fields such as constant or pulsed fields to a target (e.g., a patient or specimen). An axial magnet controller 304 is in communication with an axial magnet 306 that is generally configured to produce a substantially constant magnetic field Bo. A gradient controller 308 is configured to apply a constant or time-varying gradient magnetic field in a selected direction or in a set of directions using magnet coils 310-312 to produce respective magnetic field gradients $G_x$, $G_y$, $G_z$ or combinations thereof. An RF generator 314 is configured to deliver one or more RF pulses to a target using a transmitter coil 315. An RF receiver 316 is in communication with a receiver coil 318 and is configured to detect or measure net magnetization of spins. Slice selection gradients can be applied with the same hardware used to apply the diffusion gradients.

The gradient controller 308 can be configured to produce pulses or other gradient fields along one or more axes. By selection of such gradients as described in, for example, U.S. Pat. No. 5,539,310, an effective diffusion tensor can be found. In addition, the gradient controller 308 can be configured to apply gradient pulses or other gradient magnetic fields of different magnitudes, and associated MR signals can be detected by the RF receiver 316. A computer 324 or other processing system such as a personal computer, a workstation, a mobile computing device, or a networked computer can be provided for data acquisition, control and/or analysis. The computer 324 may include a hard disk, a removable storage medium such as a floppy disk or CD-ROM, and/or other memory such as random access memory (RAM). Computer-executable instructions for data acquisition or control can be provided on any form of tangible data storage media, and/or delivered to the computer 324 via a local area network, the Internet, or other network. Signal acquisition, instrument control, and signal analysis can be performed with distributed processing. For example, signal acquisition and signal analysis or processing can be performed at different locations.

MR signals can be obtained for a variety of gradient magnitudes and directions. Signals can be obtained by fixing a magnitude and duration of an applied pulsed-gradient magnetic field or effective magnitude of other spin-encoding magnetic field, and varying the direction in which the encoding field is applied. After signals associated with the various directions are obtained, spin encoding field magnitude is changed and another series of signals at the various directions is obtained. Alternatively, signals can be obtained by fixing the direction of the applied encoding field and varying encoding field magnitudes.

Other signal acquisition sequences can also be used. For example, while double PFG NMR and MRI acquisition are described in this application, in particular, other forms of multiple PFG NMR and MRI experiments can be used. In addition, diffusion encoding can occur prior to the MRI acquisition as a "filter" or it can be embedded or incorporated within the imaging sequence itself.

Figure 9:
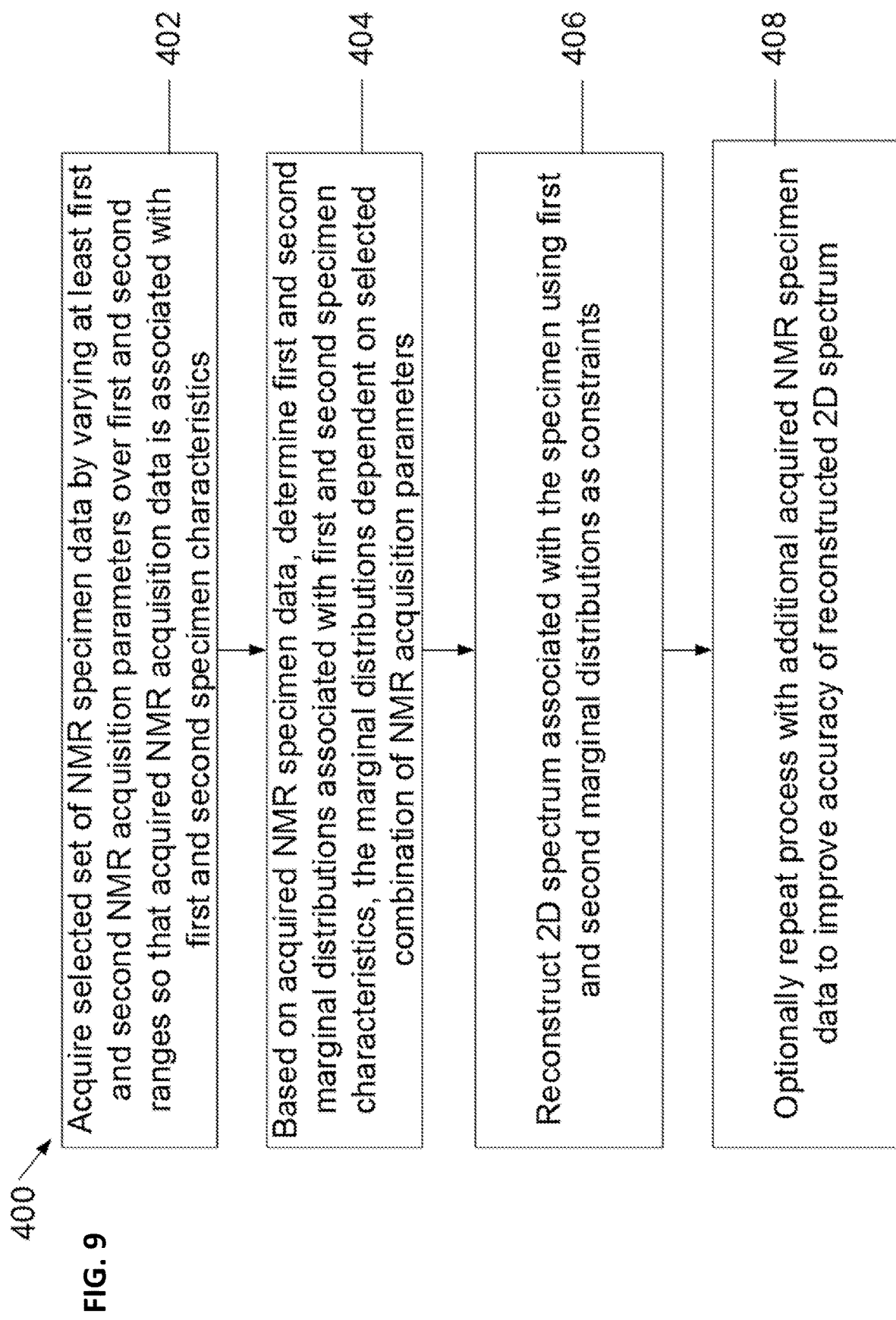
FIG. 9 is a flow chart illustrating an exemplary method of collecting magnetic resonance data.

A representative method 400 is illustrated in FIG. 9 for reconstructing a two-dimensional spectrum from a reduced amount of acquired NMR specimen data using one-dimensional marginal distributions of the data set as constraints. At 402, the exemplary method 400 can comprise acquiring a selected set of NMR specimen data by varying at least a first NMR acquisition parameter and a second NMR acquisition parameter over first and second ranges, respectively, so that the acquired NMR specimen data is associated with a first specimen characteristic and a second specimen characteristic. At 404, the method 400 can comprise determining a first marginal distribution and a second marginal distribution associated with the first and second specimen characteristics based on the acquired NMR specimen data, wherein the first and second marginal distributions depend on a selected combination of the first and second NMR acquisition parameters. Then, at 406, the method 400 can comprise reconstructing a two-dimensional spectrum associated with the specimen using the first and second marginal distributions as constraints. The first and second marginal distributions can comprise one-dimensional marginal distributions associated with the first NMR acquisition parameter and the second NMR acquisition parameter, respectively. In some embodiments of the method 400, the first specimen characteristic is diffusivity (D) and the second specimen characteristic is spin-lattice relaxation time (T1), for example. In some embodiments of the method 400, the first NMR acquisition parameter can be b-value and the second NMR acquisition parameter can be inversion time $\tau$, for example. In some embodiments of the method 400, the first and second specimen characteristics can comprise diffusivity (D), spin-lattice relaxation time (T1), spin-spin relaxation time (T2), and/or combinations thereof. The one-dimensional marginal distributions can be used as either soft constraints or hard constraints. In some embodiments of the method 400, the first and second marginal distributions can be determined using $\ell 1$ regularization. At 408, the method 400 can comprise optionally repeating the process of 402, 404, 406 with additional acquired NMR specimen data to improve accuracy of reconstructed 2D spectrum in 406. The method 400 describes steps performed in an exemplary order, but these steps can be performed in different orders, and the acquisitions of NMR specimen data and/or the determinations of marginal distributions that are described as being performed in a common step can alternatively be performed in two or more different steps.

More information regarding NMR data acquisition, determination of marginal distributions, and reconstruction of multi-dimensional spectra can be found in U.S. Pat. Nos. 7,643,863 and 8,380,280, which are incorporated by reference herein in their entirety. More information related to the determination of joint higher dimensional distributions based on lower dimensional distributions in the NMR/MRI field can be found in WO 2016/086025, published Jun. 2, 2016, which is incorporated herein by reference in its entirety.

Computational Environment

Figure 10:
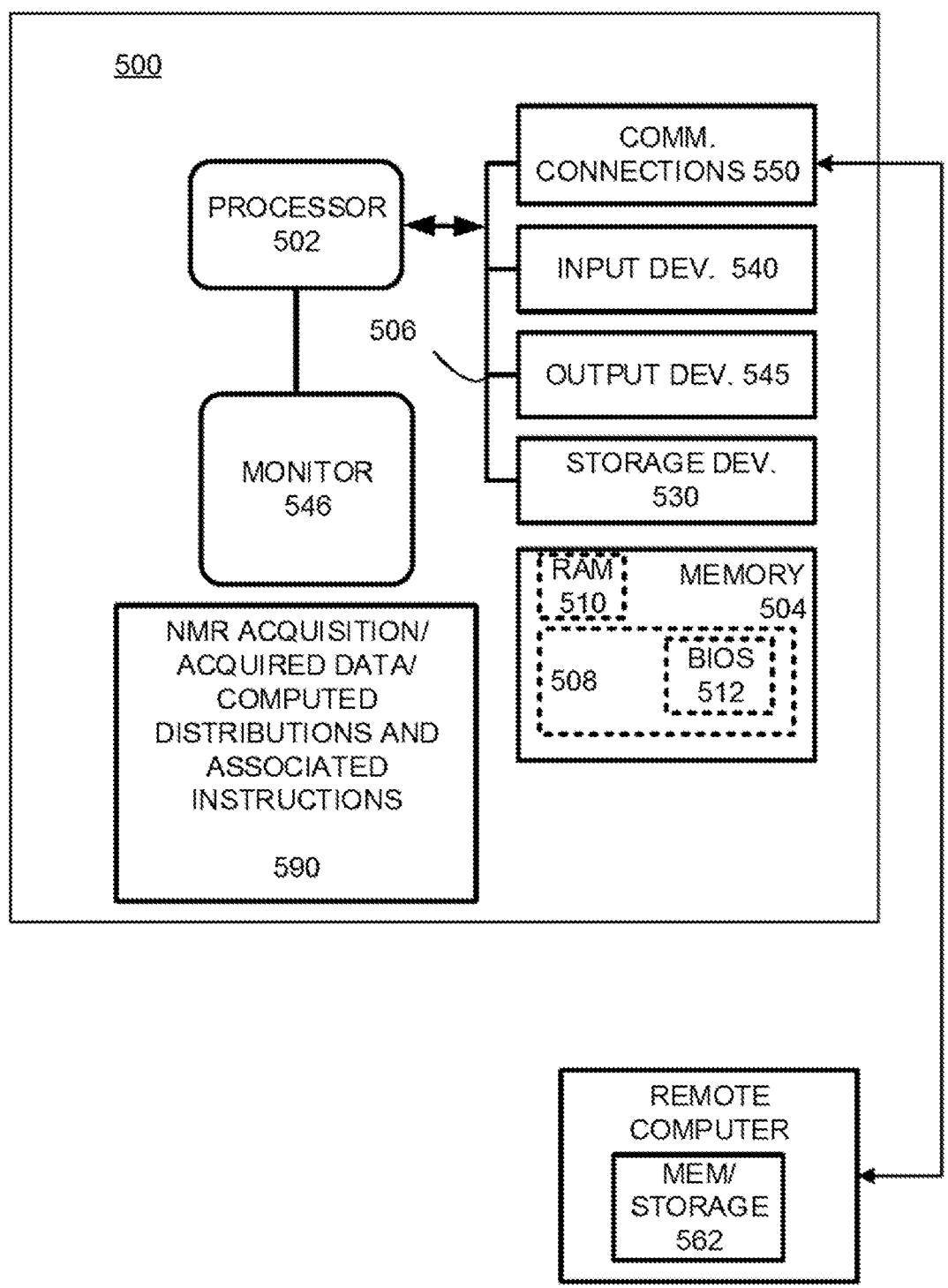
FIG. 10 is a schematic diagram illustrating a representative computational environment for performing data acquisition, storage, analysis, and other operations discussed herein.

FIG. 10 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

In a distributed computing environment, program modules may be located in both local and remote memory storage devices.

With reference to FIG. 10, an exemplary system for implementing the disclosed technology includes a general purpose computing device in the form of an exemplary conventional PC 500, including one or more processing units 502, a system memory 504, and a system bus 506 that couples various system components including the system memory 504 to the one or more processing units 502. The system bus 506 may be any of several types of bus structures including a memory bus or memory controller, a peripheral bus, and a local bus using any of a variety of bus architectures. The exemplary system memory 504 includes read only memory (ROM) 508 and random access memory (RAM) 510. A basic input/output system (BIOS) 512, containing the basic routines that help with the transfer of information between elements within the PC 500, is stored in ROM 508.

The exemplary PC 500 further includes one or more storage devices 530 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 506 by a hard disk drive interface, a magnetic disk drive interface, and an optical drive interface, respectively. The drives and their associated computer readable media provide nonvolatile storage of computer-readable instructions, data structures, program modules, and other data for the PC 500. Other types of computer-readable media which can store data that is accessible by a PC, such as magnetic cassettes, flash memory cards, digital video disks, CDs, DVDs, RAMs, ROMs, and the like, may also be used in the exemplary operating environment. As shown in FIG. 10, instructions for NMR data acquisition, acquired data, computed distributions, and processor-executable instructions for determining multi-dimensional spectra using lower dimensional spectra as constraints are stored in a memory portion 590 but storage and processing can be provided at other locations, such as locally at an NMR machine or at a remote location accessible via a wide area network.

A number of program modules may be stored in the storage devices 530 including an operating system, one or more application programs, other program modules, and program data. A user may enter commands and information into the PC 500 through one or more input devices 540 such as a keyboard and a pointing device such as a mouse. Other input devices may include a digital camera, microphone, joystick, game pad, satellite dish, scanner, or the like. These and other input devices are often connected to the one or more processing units 502 through a serial port interface that is coupled to the system bus 506, but may be connected by other interfaces such as a parallel port, game port, or universal serial bus (USB). A monitor 546 or other type of display device is also connected to the system bus 506 via an interface, such as a video adapter. Other peripheral output devices, such as speakers and printers (not shown), may be included.

The PC 500 may operate in a networked environment using logical connections to one or more remote computers, such as a remote computer 560. In some examples, one or more network or communication connections 550 are included. The remote computer 560 may be another PC, a server, a router, a network PC, or a peer device or other common network node, and typically includes many or all of the elements described above relative to the PC 500, although only a memory storage device 562 has been illustrated in FIG. 10. The personal computer 500 and/or the remote computer 560 can be connected to a logical a local area network (LAN) and a wide area network (WAN). Such networking environments are commonplace in offices, enterprise wide computer networks, intranets, and the Internet.

When used in a LAN networking environment, the PC 500 is connected to the LAN through a network interface. When used in a WAN networking environment, the PC 500 typically includes a modem or other means for establishing communications over the WAN, such as the Internet. In a networked environment, program modules depicted relative to the personal computer 500, or portions thereof, may be stored in the remote memory storage device or other locations on the LAN or WAN. The network connections shown are exemplary, and other means of establishing a communications link between the computers may be used.

For purposes of this description, certain aspects, advantages, and novel features of the embodiments of this disclosure are described herein. The disclosed methods and systems should not be construed as limiting in any way. Instead, the present disclosure is directed toward all novel and nonobvious features and aspects of the various disclosed embodiments, alone and in various combinations and sub-combinations with one another. The methods, apparatuses, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language. For example, operations described sequentially may in some cases be rearranged or performed concurrently. Moreover, for the sake of simplicity, the specification and attached figures may not show all the various ways in which the disclosed methods can be used in conjunction with other methods.

The singular terms "a", "an", and "the" include plural referents unless context clearly indicates otherwise. The term "comprises" means "includes without limitation." The term "coupled" means physically linked and does not exclude intermediate elements between the coupled elements. The term "and/or" means any one or more of the elements listed. Thus, the term "A and/or B" means "A", "B" or "A and B."

In view of the many possible embodiments to which the principles of the disclosed technology may be applied, it should be recognized that the illustrated embodiments are only preferred examples and should not be taken as limiting the scope of the disclosure. Rather, the scope of the disclosure is at least as broad as the following claims. We therefore claim all that comes within the scope of the following claims.

The invention claimed is:

1. A method, comprising:
   acquiring a selected set of magnetic resonance (MR) specimen data by varying at least a first MR acquisition parameter and a second MR acquisition parameter over first and second ranges, respectively, so that the acquired MR specimen data is associated with a first specimen characteristic and a second specimen characteristic;
   based on the acquired MR specimen data, determining a first marginal distribution and a second marginal distribution associated with the first and second specimen characteristics, the first and second marginal distributions dependent on a selected combination of the first and second MR acquisition parameters; and reconstructing a two-dimensional spectrum associated with the specimen using the first and second marginal distributions as constraints.

2. The method of claim 1, wherein the first marginal distribution and the second marginal distribution are one-dimensional marginal distributions associated with the first MR acquisition parameter and the second MR acquisition parameter, respectively.

3. The method of claim 1, further comprising:
acquiring a two-dimensional specimen data set associated with both the first MR acquisition parameter and the second MR acquisition parameter, wherein the two-dimensional spectrum is reconstructed using the two-dimensional data set.

4. The method of claim 1, wherein the first specimen characteristic is diffusivity (D) and the second specimen characteristic is spin-lattice relaxation time ($T_1$).

5. The method of claim 1, wherein the first MR acquisition parameter is b-value and the second MR acquisition parameter is inversion time $\tau$.

6. The method of claim 1, wherein the first and second specimen characteristics comprise diffusivity (D), spin-lattice relaxation time ($_{T1}$), spin-spin relaxation time ($T_2$), or combinations thereof.

7. The method of claim 1, wherein the first and second one-dimensional marginal distributions are used as soft constraints.

8. The method of claim 1, wherein the first and second one-dimensional marginal distributions are used as hard constraints.

9. The method of claim 1, wherein the first MR acquisition parameter and the second MR acquisition parameter are independent.

10. The method of any claim 1, wherein the first and second marginal distributions are determined using $\ell_1$ regularization.

11. The method of claim 1, further comprising selecting the set of MR data to be acquired so as to determine the first and second marginal distributions.

12. The method of claim 1, wherein the selected set of MR specimen data is a first set of MR data, and further comprising acquiring a second selected set of MR data, and determining the first and second marginal distributions based on the first selected set of MR data and the second selected set of MR data.

13. The method of claim 1, wherein the MR specimen data is magnetic resonance image (MRI) data.

14. The method of claim 1, wherein the MR specimen data is magnetic nuclear magnetic resonance (NMR) data.

15. The method of claim 1, wherein the MR specimen data is obtained from a non-biological specimen.

16. The method of claim 1, wherein the MR specimen data is obtained from a biological specimen.

17. The method of claim 16, wherein the MR specimen data is obtained from a human subject.

18. At least one computer readable media, comprising computer-executable instructions for performing the method of claim 1.

19. A magnetic resonance (MR) system comprising:
an MR data acquisition system; and
an MR data processor coupled to the MR data acquisition system and operable to reconstruct two-dimensional MR spectra associated with specimens using first and second marginal distributions as constraints.

20. The MR system of claim 19, wherein the MR data acquisition system is operable to acquire MR data based on applied MR signals associated with first and second MR acquisition parameters.

21. The MR system of or claim 20, wherein the first and second MR acquisition parameters are operable to produce MR signal variations associated with a first specimen characteristic and a second specimen characteristic.

22. The MR system of claim 19, wherein the MR data acquisition system includes at least a magnet situated to produce a static magnetic field and a radio-frequency pulse generator operable to induce specimen spin rotations.

23. The MR system of claim 19, wherein the first specimen characteristic is diffusivity (D) and the second specimen characteristic is spin-lattice relaxation time ($T_1$).

24. The MR system of claim 19, wherein the first MR acquisition parameter is b-value and the second MR acquisition parameter is inversion time ($\tau$).

25. The MR system of claim 19, wherein the first and second specimen characteristics comprise diffusivity (D), spin-lattice relaxation time ($T_1$), spin-spin relaxation time ($T_2$), or combinations thereof.

26. The MR system of claim 19, wherein the MR data processor is operable to determine the first and second marginal distributions using $\ell_1$ regularization.

27. The magnetic resonance (MR) system of claim 19, wherein the MR data acquisition system is a magnetic resonance imaging (MRI) system or a nuclear magnetic resonance (NMR) system.

28. The magnetic resonance (MR) system of claim 19, wherein specimens are biological.

29. The magnetic resonance (MR) system of claim 19, wherein specimens are non-biological specimens.

* * * * *